United States Patent
Shi et al.

(10) Patent No.: US 7,557,634 B2
(45) Date of Patent: Jul. 7, 2009

(54) LOW-POWER CONSUMPTION HIGH-VOLTAGE CMOS DRIVING CIRCUIT

(75) Inventors: Longxing Shi, Jiangsu (CN); Weifeng Sun, Jiangsu (CN); Haisong Li, Jiangsu (CN); Shengli Lu, Jiangsu (CN); Yangbo Yi, Jiangsu (CN)

(73) Assignee: Southeast University, Jiangsu, Shina ( * ) Notice: Subject to any disclaimer, the term of this patent is extended or adjusted under 35 U.S.C. 154(b) by 0 days.

(21) Appl. No.: 11/596,272

(22) PCT Filed: Oct. 20, 2004

(86) PCT No.: PCT/CN2004/001187

§ 371 (c)(1),
(2), (4) Date: Nov. 13, 2006

(87) PCT Pub. No.: WO2006/010298

PCT Pub. Date: Feb. 2, 2006

(65) Prior Publication Data
US 2007/0205820 A1 Sep. 6, 2007

(30) Foreign Application Priority Data
Jul. 30, 2004 (CN) .................. 2004 1 0041564

(51) Int. Cl.
H03L 5/00 (2006.01)
(52) U.S. Cl. .................. 327/333; 326/81; 326/62
(58) Field of Classification Search ............. 327/306, 327/333; 326/62–64, 80–81
See application file for complete search history.

(56) References Cited

U.S. PATENT DOCUMENTS 5,818,257 A 10/1998 Villa (Continued)

FOREIGN PATENT DOCUMENTS

CN 1315784 10/2001

(Continued)

*Primary Examiner*—Dinh T. Le
(74) *Attorney, Agent, or Firm*—Meyertons, Hood, Kivlin, Kowert & Goetzel, P.C.; Eric B. Meyertons (57) ABSTRACT

The low power consumption CMOS high voltage driving circuit relates to a kind of high voltage driving circuit for output driving, and there is an out buffer stage between the output end of the level switch stage and the input end of the high voltage output stage, comprising a high voltage PMOS pipe and a high voltage NMOS pipe. The source of the high voltage PMOS pipe is connected with the power supply, its gate electrode is connected with the output end of the upper level out buffer unit as the input end of the current level out buffer unit. The source of the high voltage NMOS pipe is put to earth, and its gate electrode serves as the receiving end of the 3ith sequence signal. The drain region of the high voltage PMOS pipe is connected with that of the high voltage NMOS pipe and is connected with the input end of the lower level out buffer unit as the output end of the current level out buffer unit. The input end of the first out buffer unit is connected with the output end of the level switch stage as the input end of the out buffer stage, and the output end of the final output buffer unit is connected with another input end of the high voltage output stage as the output end of the out buffer stage.

5 Claims, 5 Drawing Sheets

U.S. PATENT DOCUMENTS

| | | | |
|---|---|---|---|
| 6,014,039 | A | 1/2000 | Kothandaraman et al. |
| 6,097,214 | A * | 8/2000 | Troussel et al. ............... 326/63 |
| 6,262,599 | B1 * | 7/2001 | Coughlin et al. .............. 326/81 |
| 6,768,368 | B2 * | 7/2004 | Kaneko et al. .............. 327/333 |

FOREIGN PATENT DOCUMENTS

| | | |
|---|---|---|
| CN | 137593 | 10/2002 |
| JP | 2001-77685 | 3/2001 |
| JP | 2004-146403 | 5/2004 |

\* cited by examiner

LOW-POWER CONSUMPTION HIGH-VOLTAGE CMOS DRIVING CIRCUIT

FIELD OF THE INVENTION

This invention relates to a high voltage driving circuit, especially a low power consumption CMOS high voltage driving circuit. The operating low voltage is usually below 5V (5V included) and the high voltage is from 5V to 500V or even higher.

DESCRIPTION OF THE RELATED ART

Along with the fast development of the semiconductor industry, diversified power integration chips are applied to more and more fields, such as AC motor control, flat panel display driving circuits, printer driving circuits and sound amplification systems. These driving chips require high voltage driving circuits.

The CMOS high voltage driving circuit is a common output driving circuit. A CMOS high voltage driving circuit has a PMOS pipe and a NMOS pipe between the power supply and the ground. Upon receipt of one control signal, the NMOS is closed (open) when PMOS is open (closed). When the PMOS is open and NMOS is closed, the output end and the power supply are in a short circuit situation and a high potential is output. When the PMOS is closed and NMOS is open, the output end and the ground are in a short circuit situation and a low potential is output.

But this type of CMOS circuit has some defects, namely when the output level is changed from low to high or from high to low, high voltage PMOS and high voltage NMOS are both in the open state for a short period, and the electric current from the power supply to the ground is called the "simultaneous on state current". (See FIG. 1) For example, suppose the original state low voltage control signal LV2 is at a high level and LV1 is at a low level, then N1 is open and N2 is closed, and P2 is open and P1 is closed. Here, if LV2 is changed to low level, N1 will be closed; when LV1 is changed to high level, N2 will be opened. High voltage PMOS pipe (P1) will be opened due to the potential drop of HV2, and the PMOS pipe (P2) is closed when the HV1 potential rises to high level. When HV1 is changing from low level to high level, P2 and N2 are in the open state for a certain period, resulting in simultaneous on state current from the power supply to the ground. The current size depends on the size of P2 and N2 as well as their working voltage. The higher width to length ratio and higher working voltage of P2 and N2 lead to higher simultaneous on state current and more power consumption due to simultaneous initiation of P2 and N2.

Figure 1:
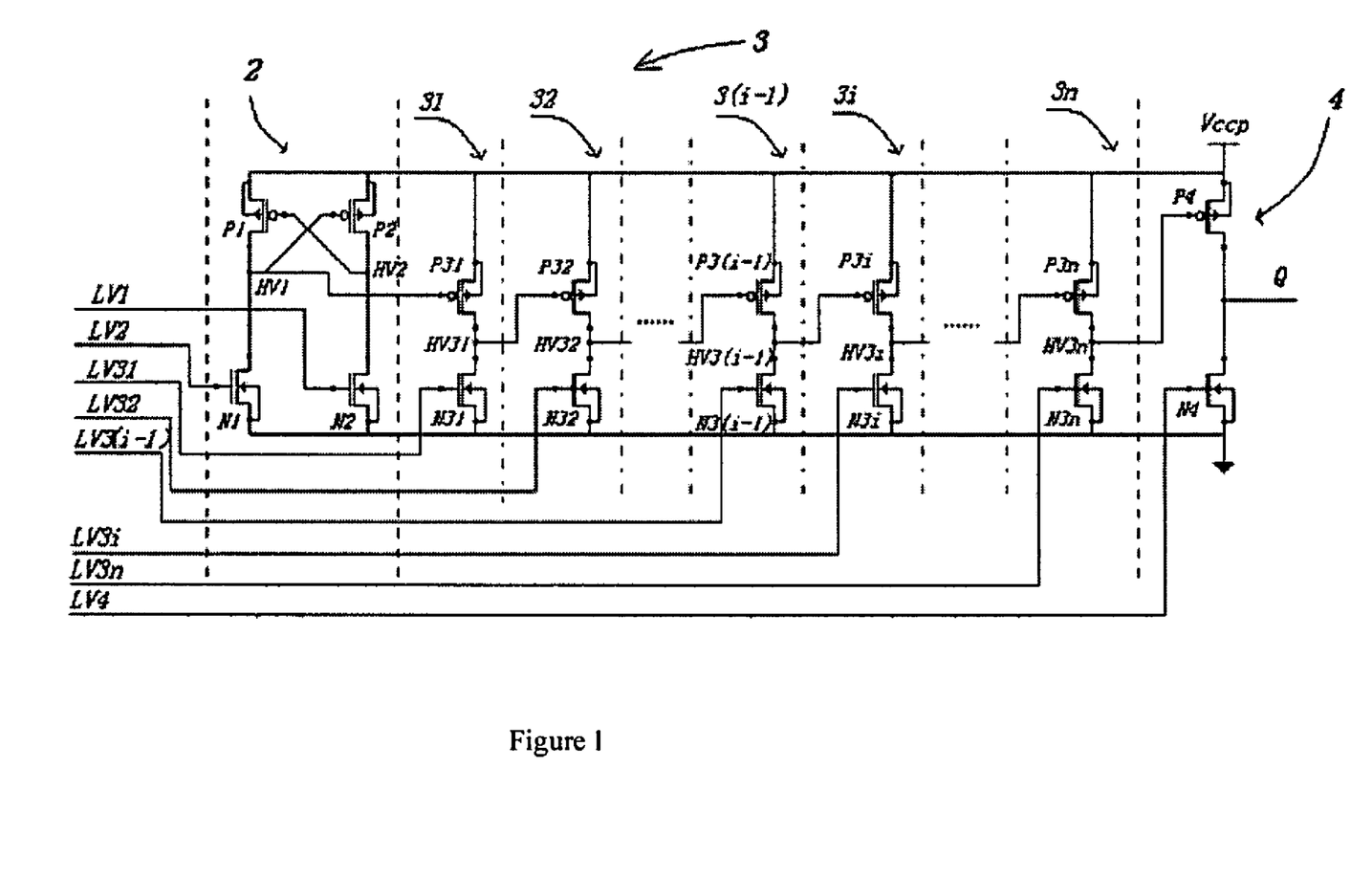
FIG. 1 is a schematic diagram of a low power consumption CMOS high voltage driving circuit.

In a like manner, if LV1 is changed to a low level, N2 will be closed, and when LV2 is changed to a high level, N1 will be opened. Then P2 is opened due to the potential drop of HV1, and P1 is closed due to the potential rise of HV2. Here HV1 output is changed from high level to low level. Also, when HV1 is changing from high level to low level, both P1 and N1 are in the open state for a certain period, resulting in simultaneous on state current from the power supply to the ground. The current size depends on the size and working voltage of P1 and N1. The higher width to length ratio and higher working voltage of P1 and N1 lead to bigger simultaneous on state current and bigger power consumption due to simultaneous initiation of P1 and N1. In the high voltage driving chips, the width to length ratio of P1 and P2 as well as N1 and N2 is often large (hundreds to one), and the working voltage is high (tens of volts to hundreds of volts), thus such chips have great simultaneous on state power consumption.

The simultaneous on state current is negligible when the devices are of a small size, but the CMOS driving circuit, especially when being applied to high-voltage high-power occasions, have a larger width to length ratio and the on state power dissipation takes a bigger part in the total power consumption. Described herein is a low power consumption and high speed CMOS high voltage driving circuit, which can reduce the simultaneous on state power dissipation by several times and is applicable to occasions requiring higher driving power.

SUMMARY OF THE INVENTION

This invention relates to a low power consumption CMOS high voltage driving circuit that may reduce the power consumption and enhance the capacity of resisting disturbance, and is applicable to high voltage high power driving chips.

The following technical proposal is adopted to accomplish this:

A low power consumption CMOS high voltage driving circuit for output driving, includes a level switch stage 2 and high voltage output stage 4. The two input ends of the level switch stage 2 are the input ends of the first sequence signal LV1 and the second sequence signal LV2. An input end of high voltage output stage 4 is the input end of the fourth sequence signal LV4. There is an out buffer stage 3 between the output end (HV1) of level switch stage 2 and another input end of high voltage output stage 4, comprising at least an out buffer unit 31 composed of a high voltage PMOS pipe P3$i$ and a high voltage NMOS pipe N3$i$. The source of P3$i$ is connected to the power supply Vccp, its gate electrode is connected with the output end (HV3$i$-1) of the upper level out buffer unit (3$i$-1) as the input end of the current level out buffer unit (3$i$). The source of N3$i$ is connected to ground and its gate electrode serves as the receiving end of the 3ith sequence signal LV3$i$. The drain region of P3$i$ is connected with that of N3$i$ and is connected with the input end of the lower level out buffer unit 3$i$+1 as the output end of the current out buffer unit 3$i$. The input end of the first out buffer unit (31) is connected with the output end (HV1) of the level switch stage (2) as the input end of the out buffer stage (3), the output end of the final output buffer unit (3$n$) is connected with another input end of the high voltage output stage (4) as the output end (HV3$n$) of the out buffer stage (3).

As compared with existing technologies, this device has the following advantages:

(1) CMOS technology is adopted completely. CMOS is featured in fast switching speed, low power consumption, and simple preparation technology. The high voltage CMOS described herein is superior in the high voltage high power environment, is fully compatible with low voltage CMOS process technology and may be used to prepare high voltage high power driving chips easily.

Figure 2:
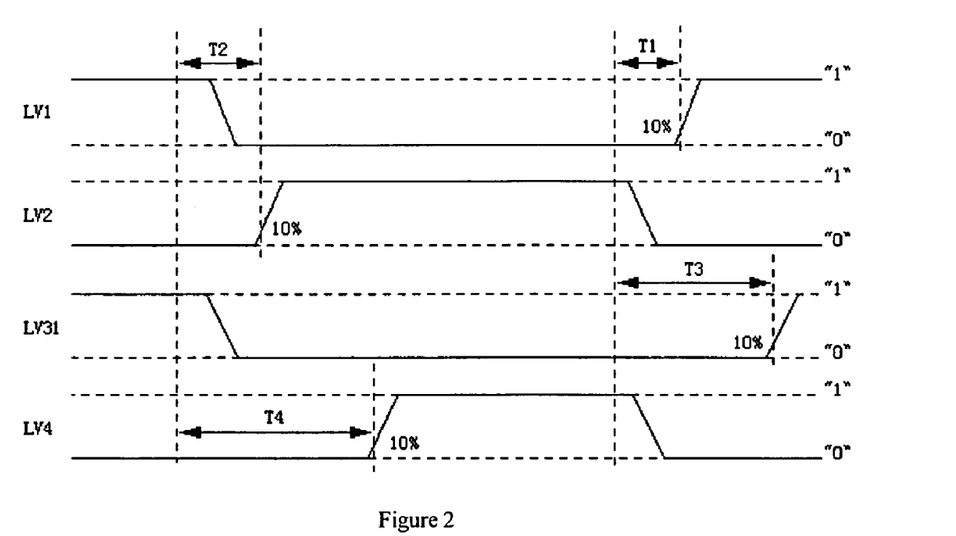
FIG. 2 depicts the sequence signal wave pattern of a CMOS high voltages driving circuit. The high voltage driving circuit realizes low power consumption when the waveform satisfies the requirement for delay, and T1, T2, T3 and T4 in the figure are the delay times.
Figure 3:
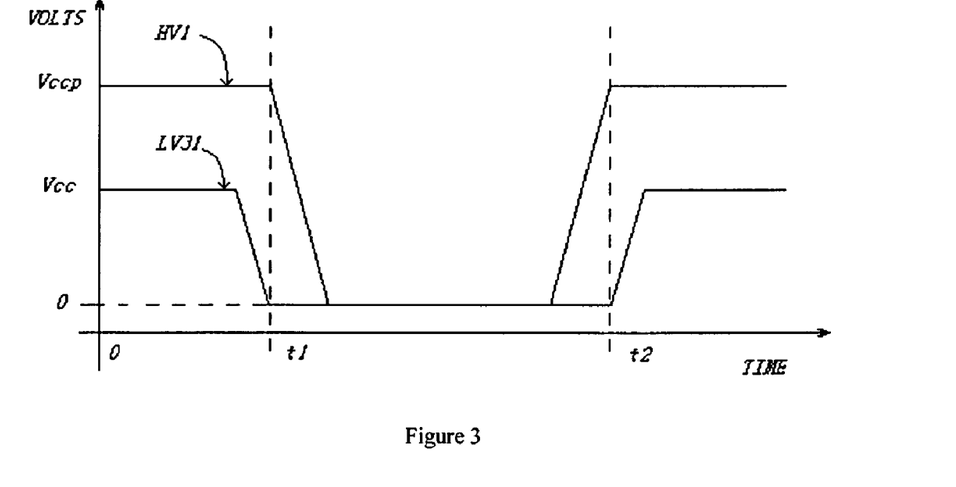
FIG. 3 depicts the wave patterns of the first sequence signal HV1 and the third sequence signal LV31. With LV1 and LV3 being interlaced, the out buffer stage has no simultaneous on state current.
Figure 4:
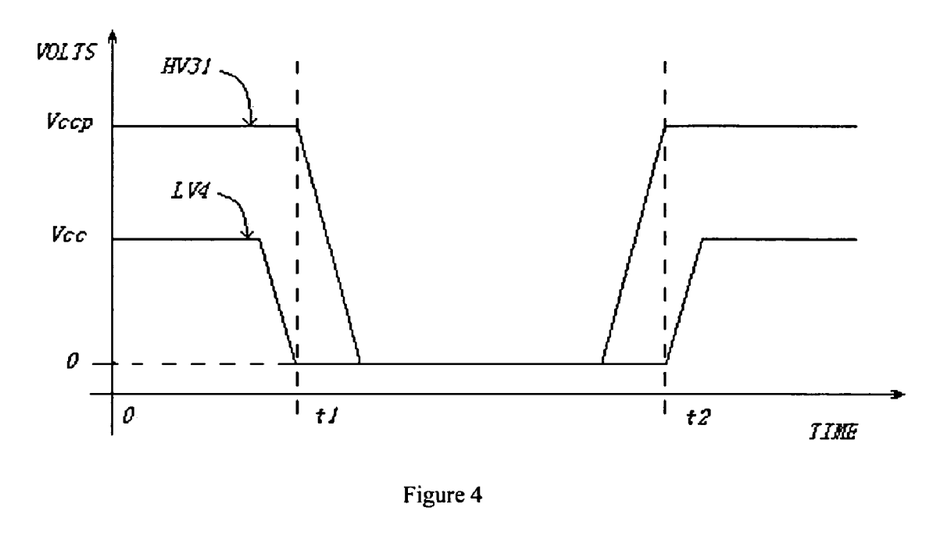
FIG. 4 depicts the wave patterns of the third sequence signal HV31 and the fourth sequence signal LV4. With LV3 and LV4 being interlaced, the high voltage output stage has no simultaneous on state current.

(2) This device adopts the out buffer stage, and sequential control of the high voltage driving circuit is done through the mutually independent low voltage driving signals (see FIG. 2), which guarantees that the buffer stage and the PMOS and NMOS of the high voltage output stage shall not be opened simultaneously (see FIG. 3 and FIG. 4) and there is no simultaneous on state power consumption thereby.

Figure 5:
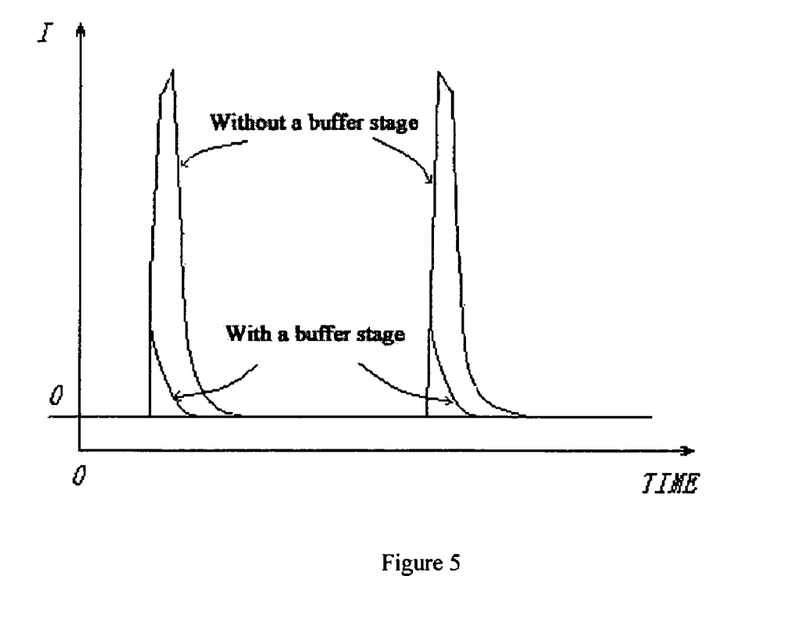
FIG. 5 is a comparison diagram of the simultaneous on state current when buffer stage is provided and when a buffer stage is absent. Without a buffer stage added, the simultaneous on state current is reduced distinctly.

(3) The snubber circuit may reduce the size of the high voltage CMOS pipe of the level switch stage, and greatly reduce the simultaneous on state current and power consumption thereby (see FIG. 5).

(4) The snubber circuit may screen the disturbance of high voltage output signals on the level switch stage circuit and enhance the anti-jamming capacity of the high voltage driving circuit.

(5) The duty ratio of the high voltage output signals is close to 1 through regulating the time sequence of the 4 mutually independent low-pressure control signals.

(6) This invention is more superior under high voltage conditions (tens of volts to hundreds of volts), since the simultaneous on state current is huge with high working voltage and the simultaneous on state power consumption takes a bigger share in the total power consumption. The on state current may be reduced greatly by adopting this invention, and the power consumption can be reduced accordingly.

BRIEF DESCRIPTION OF THE DRAWINGS

This invention is described with following figures, wherein.

DETAILED DESCRIPTION OF THE INVENTION

Described herein is a kind of low power consumption CMOS high voltage driving circuit for output driving, including a level switch stage 2 and high voltage output stage 4. The two input ends of the level switch stage 2 are input ends of the first sequence signal LV1 and the second sequence signal LV2 and an input end of the high voltage output stage 4 is the input end of the fourth sequence signal LV4. There is an out buffer stage 3 between the output end (HV1) of the level switch stage (2) and another input end of the high voltage output stage (4), which includes at least one out buffer unit (3$i$). 3$i$ includes a high voltage PMOS pipe (P3$i$) and a high voltage NMOS pipe (N3$i$). The source of P3$i$ is connected with the power supply (Vccp), the gate electrode of P3$i$ is connected with the output end (HV3$i$-1) of the upper level out buffer unit (3$i$-1) as the input end of the current out buffer unit (3$i$), the source of N3$i$ is coupled to ground, and the gate electrode of N3$i$ serves as the receiving end of the 3ith sequence signal (LV3$i$). The drain region of P3$i$ is connected with the drain region of N3$i$ and is connected with the input end of the next level out buffer unit (3$i$+1) as the output end (HV$i$) of the current level out buffer unit (3$i$). The input end of the first out buffer unit (3$i$) is connected with the output end (HV1) of the level switch stage (2) as the input end of the out buffer stage (3), the output end of the final output buffer unit (3$n$) is connected with another input end of the high voltage output stage (4) as the output end (HV3$n$) of the out buffer stage (3).

The out buffer stage 3 may contain only one out buffer unit 31 or two, three, four, five or more out buffer units. When the out buffer stage 3 only contains one out buffer unit 31 (see FIG. 1), this unit may be regarded as the first out buffer unit or the final output buffer unit, and its input end is the input end of the out buffer stage 3 and is connected with the output end of the level switch stage 2, and its output end is the output end of the out buffer stage 3 and is connected with another input end of the high voltage output stage 4.

Figure 6:
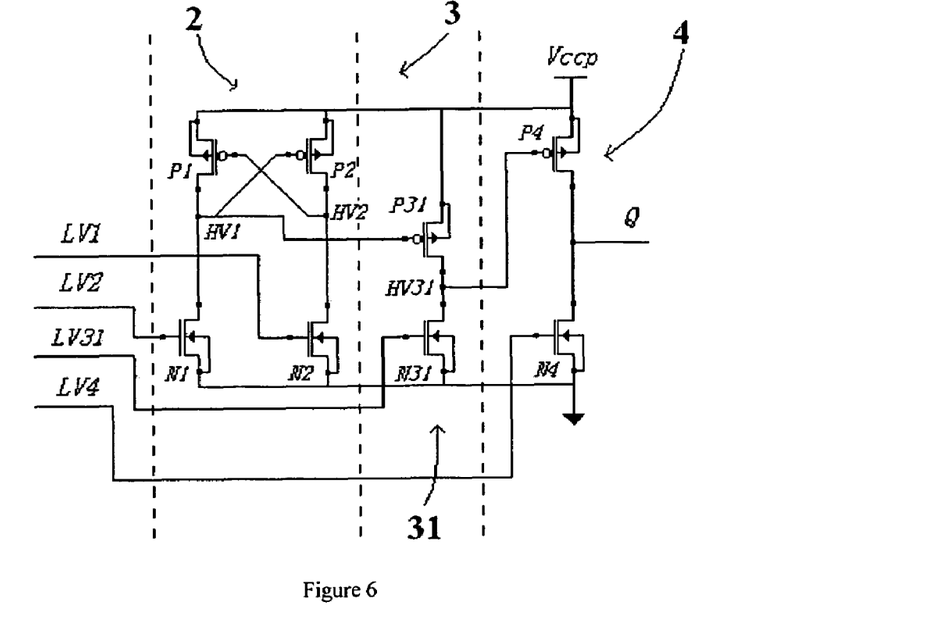
FIG. 6 is a schematic diagram of a low power consumption CMOS high voltage driving circuit with one out buffer stage.
Figure 7:
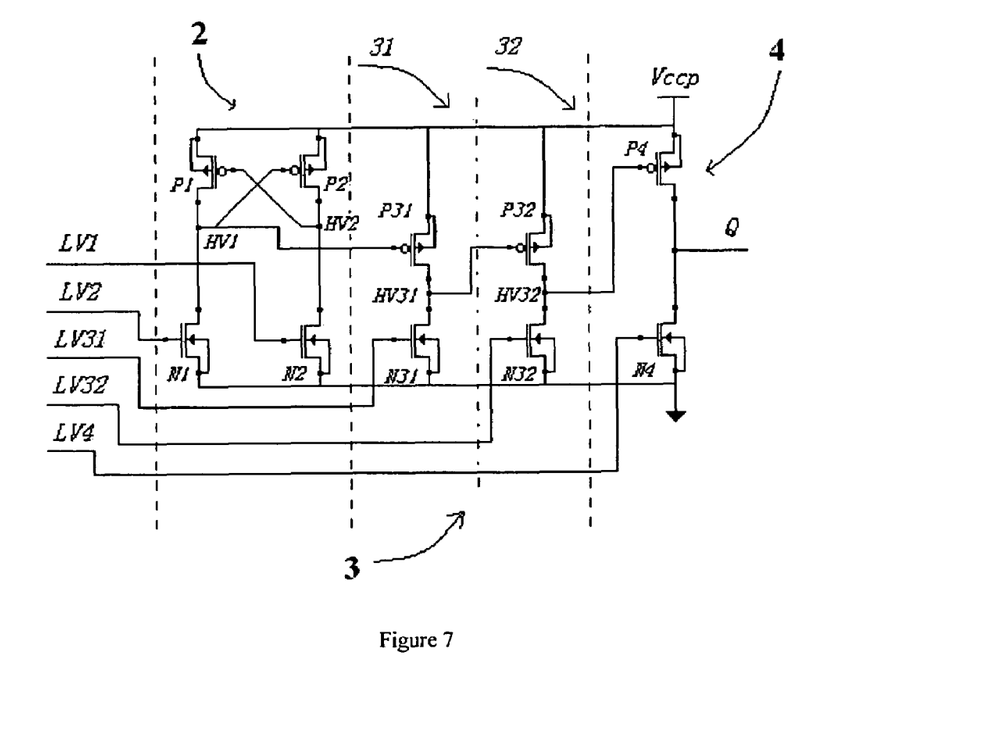
FIG. 7 is a schematic diagram of a low power consumption CMOS high voltage driving circuit with two out buffer stages.
Figure 8:
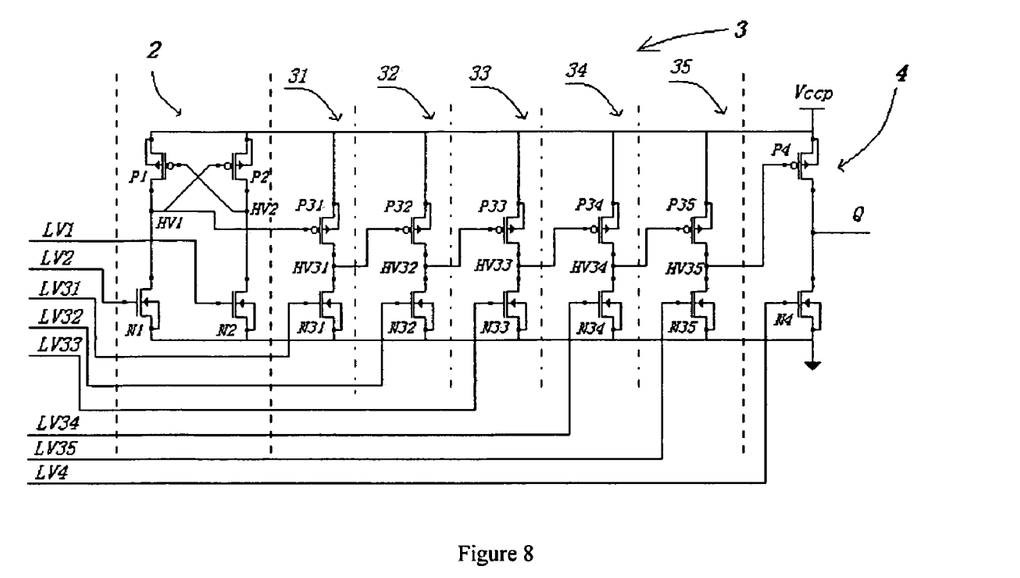
FIG. 8 is a schematic diagram of a low power consumption CMOS high voltage driving circuit with five out buffer stages.

When the out buffer stage 3 includes two out buffer units, the out buffer stage 3 includes first out buffer unit 31 and the second out buffer unit 32. First out buffer unit 31 serves as the first out buffer unit and second out buffer unit 32 as the final output buffer unit. The output end (HV31) of buffer unit 31 is connected with the input end of buffer unit 32. The plan is as follows: Referring to FIG. 6 the source of the high voltage PMOS pipe (P31) of the first out buffer unit is connected with the power supply Vccp, the gate electrode of P31 is connected with the output end (HV1) of the level switch stage 2 as the input end of the out buffer stage 3, the source of the high voltage NMOS pipe (N31) of the first out buffer unit 31 is coupled to ground, the gate electrode of N31 serves as receiving end of the 31st sequence signal (LV31), the drain region of P31 is connected with the drain region of N31 and connected with the gate electrode of the high voltage PMOS pipe (P32) of the second out buffer unit that serves as the input end of the second out buffer unit (32) as the output end (HV31) of the first out buffer unit 31. The source of the high voltage PMOS pipe (P32) of the second out buffer unit is connected with the power supply (Vccp), the source of the high voltage NMOS pipe (N32) of the second out buffer unit is coupled to ground, the gate electrode of N32 serves as the receiving end of the 32nd sequence signal (LV32), the drain region of P32 is connected with that of N32 and connected with another input end of the high voltage output stage 4 as the output end (HV32) of the out buffer stage 3; When the out buffer stage 3 has five out buffer units, the out buffer stage 3 is composed of the first out buffer unit 31, the second out buffer unit 32, the third out buffer unit 33, the fourth out buffer unit 34 and the fifth out buffer unit 35. Unit 31 serves as the first out buffer unit, Unit 35 as the final output buffer unit and the plan is as follows: Referring to FIG. 7) the source of the high voltage PMOS pipe (P31) of the first out buffer unit is connected with the power supply Vccp, the gate electrode of P31 is connected with the output end (HV1) of the level switch stage 2 as the input end of the out buffer stage 3, the source of the high voltage NMOS pipe (N31) of the first out buffer unit 31 is coupled to ground, the gate electrode of N31 serves as receiving end of the 31st sequence signal (LV31), the drain region of P31 is connected with the drain region of N31 and connected with the gate electrode of the high voltage PMOS pipe (P32) of the lower stage out buffer unit that serves as the input end of the lower stage out buffer unit (32) and as the output end (HV31) of the first out buffer unit 31. The source of the high voltage PMOS pipe (P32) of the second out buffer unit is connected with the power supply (Vccp), the source of the high voltage NMOS pipe (N32) of the second out buffer unit is put to earth, the gate electrode of N32 serves as the receiving end of the 32nd sequence signal (LV32), the drain region of P32 is connected with that of N32 and connected with the gate electrode of the high voltage PMOS pipe (P33) of the third out buffer unit that serves as the input end of the third out buffer unit (33) as the output end of the current out buffer unit (32). The source of the high voltage PMOS pipe (P33) of the third out buffer unit is connected with the power supply (Vccp), the source of the high voltage NMOS pipe (N32) of the third out buffer unit is coupled to ground, the gate electrode of N33 serves as the receiving end of the 33rd sequence signal (LV33), the drain region of P33 is connected with that of N33 and connected with the gate electrode of the high voltage PMOS pipe (P34) of the fourth out buffer unit that serves as the input end of the fourth out buffer unit (34) as the output end of the current out buffer unit (33). The source of the high voltage PMOS pipe (P34) of the fourth out buffer unit is connected with the power supply (Vccp), the source of the high voltage NMOS pipe (N34) of the fourth out buffer unit is coupled to ground, the gate electrode of N34 serves as the receiving end of the 34th sequence signal (LV34), the drain region of P34 is connected with that of N34 and connected with the gate electrode of the high voltage PMOS pipe (P35) of the fifth out buffer unit that serves as the input end of the fifth out buffer unit (35) as the output end of the current out buffer unit (HV34). The source of the high voltage PMOS pipe (P35) of the fifth out buffer unit is connected with the power supply (Vccp), the source of the high voltage NMOS pipe (N35) of the fifth out buffer unit is coupled to ground, the gate electrode of N35 serves as the receiving end of the 35th sequence single (LV35), the drain region of P35 is connected with that of N35 and connected with another input end of the high voltage output stage 4 as the output end (HV35) of the out buffer stage 3.

The above level switch stage 2 includes two high voltage PMOS pipes (P1 and P2) and two high voltage NMOS pipes (N1 and N2). The gate electrode of N1 and N2 serve as the two input ends of the level switch stage 2 and the input ends of the first sequence signal and the second sequence signal. The source of N1 and N2 is put to earth and that of P1 and P2 is connected with power supply Vccp. The gate electrode of P1 is connected with the drain region of P2, the gate electrode of P2 is connected with the drain region of P1, the drain region of N2 for receiving the first sequence signal is connected with that of P2 and form the connection point (HV2), and the drain region of N1 for receiving the second sequence signal is connected with that of P1 and form the output end (HV1) of the level switch stage 2.

The high voltage output stage 4 is composed of the high voltage PMOS pipe (P4) and the high voltage NMOS pipe (N4). The drain regions of P4 and N4 are connected and serve as the output end (Q) of the CMOS high voltage driving circuit. The source of N4 is coupled to ground, the gate electrode of N4 serves as an input end of the high voltage output stage 4 (also the input end of the fourth sequence signal LV4), the source of P4 is connected with the power supply Vccp, the gate electrode of P4 is connected with the output end (HV3n) of the output buffer stage 3 as another input end of the high voltage output stage 4.

Figure 9:
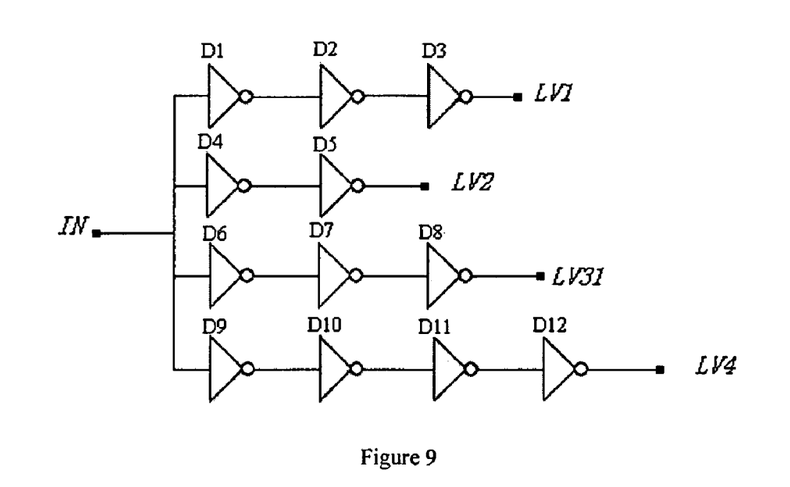
FIG. 9 is a schematic diagram of a low voltage driving circuit with a phase reverser.

The sequence signals could be generated by the common low voltage drivers provided in the existing technologies and see FIG. 9 for the detailed circuit.

The above high voltage PMOS pipes may be horizontal or vertical double diffusion PMOS pipes whose operational withstand voltage is above 5V, and the above high voltage NMOS pipes may be horizontal or vertical double diffusion NMOS pipes whose operational withstand voltage is above 5V.

The devices described herein are mainly applied to high voltage driving chips, thus its preparation technology is the same as that for high voltage driving chips. The detailed process is as follows: select P-type substrate first, and then N-type drift region and P-type drift region vegetation; prepare gate oxide layer; grow and sculpture polysilicon gate and polycrystalline silicon field pole plates; then prepare the source and drain region, and prepare and passivate the fairlead and aluminum lead. The preparation process is the same as that for high voltage driving chips. The devices described herein are mainly applied to flat panel display driving chips, motor driving chips, printer driving chips, etc. as the high voltage driving circuit.

What is claimed is:

1. A low power CMOS driver circuit for power output, comprising:
    a plurality of terminals receiving one or more sequenced input low voltage control signals;
    a potential shifting circuit configured to receive at least two of the said low voltage control signals and issue high voltage output control signals;
    a high voltage output stage comprising a first control gate and a second control gate, wherein the first control gate is configured to receive at least one of the said low voltage control signals; and
    an output buffer circuit coupled to the output of the potential shifting circuit and the second control gate of the high voltage output stage, comprising one or more coupled output buffer cells, each output buffer cell comprising:
        a power P-channel MOS transistor configured to receive a high voltage potential at a source of the P-channel MOS transistor and comprising a gate electrode coupled to the output of a previous output buffer cell; and
        a power N-channel MOS transistor configured to receive a reference potential at a source and comprising a gate electrode coupled to a low voltage control signal,
        wherein the drain of the P-channel MOS transistor and the N-channel MOS transistor are connected together as an output to the gate of a P-channel MOS transistor in next output buffer cell,
        wherein the N-channel MOS transistor in the first of all of the output buffer cells has a control gate coupled to the output of the potential shifting circuit and the output of the last of all the output buffer cells is coupled to the second control gate of the high voltage output stage,
        wherein if only one output buffer cell is present, the output buffer cell is the first and also the last output buffer cell;
    wherein the said received input low voltage control signals are mutually independent and sequenced by low voltage drivers such that, when one of the P-channel and N-channel MOS transistors of the buffer or high voltage output stage is turned on, the other one of these transistors in the same stage is turned off to avoid any simultaneous conduction of these transistors, and wherein when one of the P-channel and N-channel MOS transistors of the last buffer is turned on, the same type transistor in the high voltage output stage is turned off.

2. The low power CMOS driver circuit of claim 1, wherein the output buffer circuit comprises two output buffer cells, one serving as the first and the other as the last, wherein the output of the first output buffer cell is coupled with the control gate input of the last output buffer cell.

3. The low power CMOS driver circuit of claim 1 wherein the output buffer circuit includes five output buffer cells, a first, second, third, fourth and fifth, wherein the fifth of the output buffer cells is also the last one.

4. The low power CMOS driver circuit of claim 1, wherein the potential shifting circuit comprises two power P-channel MOS transistors receiving a high voltage potential on a source and two power N-channel MOS transistor receiving a reference potential on a source, wherein the gate electrodes of the two power N-channel MOS transistors serve as two input terminals of the potential shifting circuit, the gate electrode of the one P-channel MOS transistor is coupled with the drains of the other P-channel MOS transistor and one N-channel MOS transistor, and its drain is coupled with the gate of the other P-channel MOS transistor and the drain of the other N-channel MOS transistor as the output of the potential shifting circuit.

5. The low power CMOS driver circuit of claim 1, wherein the first control gate of the high voltage output stage comprises an N-channel MOS transistor receiving a reference potential on a source and having a gate electrode coupled to a low voltage control signal, wherein the second control gate of the high voltage output stage comprises a P-channel MOS transistor receiving a high voltage potential on a source and having a gate electrode coupled to the output of output buffer, and wherein the drain of the P-channel and N-channel MOS transistors of the power output circuit are coupled together as an output.

* * * * *

UNITED STATES PATENT AND TRADEMARK OFFICE
CERTIFICATE OF CORRECTION

PATENT NO.        : 7,557,634 B2                                    Page 1 of 1
APPLICATION NO.   : 11/596272
DATED             : July 9, 2009
INVENTOR(S)       : Shi et al.

It is certified that error appears in the above-identified patent and that said Letters Patent is hereby corrected as shown below:

On Title Page Item [56] In the Foreign Application Priority Data:

Please delete "2004 1 0041564" and substitute therefor -- 2004 1 0041564.6 --.

Signed and Sealed this

Twenty-second Day of September, 2009

David J. Kappos
*Director of the United States Patent and Trademark Office*